United States Patent [19]

Moser et al.

[11] Patent Number: 4,913,932
[45] Date of Patent: Apr. 3, 1990

[54] METHOD FOR THE PRODUCTION OF A COMPONENT WITH A FILLED LAYER

[75] Inventors: Thomas Moser, Schnaittach; Klaus Otto, Nuremberg; Horst Kippenberg, Herzogenaurach; Ralf-Dieter Krause, Nuremberg, all of Fed. Rep. of Germany

[73] Assignee: Siemens Aktiengesellschaft, Berlin and Munich, Fed. Rep. of Germany

[21] Appl. No.: 86,520

[22] Filed: Aug. 18, 1987

[30] Foreign Application Priority Data

Aug. 18, 1986 [DE] Fed. Rep. of Germany ....... 3627936

[51] Int. Cl.$^4$ .............................................. B05D 5/12
[52] U.S. Cl. .................................... 427/123; 427/431; 427/238
[58] Field of Search ......................... 427/123, 431, 238

[56] References Cited

U.S. PATENT DOCUMENTS

| 3,679,950 | 7/1972 | Rutt ........................ 317/258 |
| 3,772,748 | 11/1973 | Rutt ........................ 29/25.42 |
| 3,829,356 | 8/1974 | Rutt ........................ 161/161 |
| 3,879,645 | 4/1975 | Rutt et al. ................ 317/258 |
| 3,965,552 | 6/1976 | Rutt ........................ 29/25.42 |
| 4,019,168 | 4/1977 | Collins .................... 427/123 |
| 4,030,004 | 6/1977 | Rutt ........................ 361/313 |
| 4,071,880 | 1/1978 | Rutt ........................ 361/309 |
| 4,353,957 | 10/1982 | Rutt et al. ................ 428/292 |
| 4,430,690 | 2/1984 | Chance ..................... 29/25.42 |
| 4,584,629 | 4/1986 | Garcia ..................... 361/321 |

FOREIGN PATENT DOCUMENTS

| 566871 | 12/1958 | Canada ..................... 427/431 |
| 2323921 | 8/1975 | Fed. Rep. of Germany . |
| 2218170 | 10/1976 | Fed. Rep. of Germany . |
| 2462006 | 6/1978 | Fed. Rep. of Germany . |
| 2462008 | 9/1979 | Fed. Rep. of Germany . |
| 2264943 | 10/1979 | Fed. Rep. of Germany . |
| 2445087 | 11/1985 | Fed. Rep. of Germany . |
| 053267 | 4/1979 | Japan ...................... 427/123 |

OTHER PUBLICATIONS

Jaffee, et al., "Indium Alloys Finding Important Commercial Uses," Materials & Methods 113, (Sep. 1952).
Kirk—Othmer, "Encyclopedia of Chemical Technology", John Wiley & Sons, 1979, vol. 5, pp. 234–235.

Primary Examiner—Shrive Beck
Assistant Examiner—Vi Duong Dang
Attorney, Agent, or Firm—Kenyon & Kenyon

[57] ABSTRACT

The invention relates to a method for the production of a filled layer component made out of a monolithic ceramic body by impregnating a ceramic layer body of dense and porous layers with liquid impregnating material which wets the ceramic and by applying contacts. According to the invention the contacts are applied following the impregnation process without any further intermediate steps, and an electrical bonding of the contacts to the metal filler takes place.

11 Claims, 1 Drawing Sheet

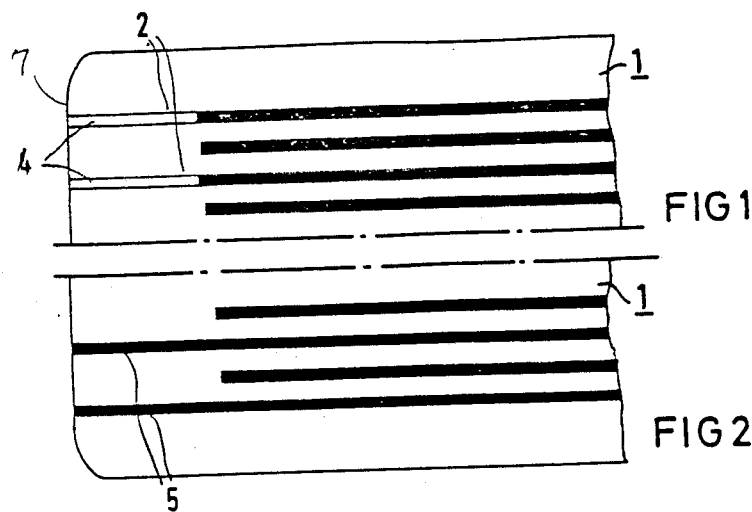
FIG 1
FIG 2
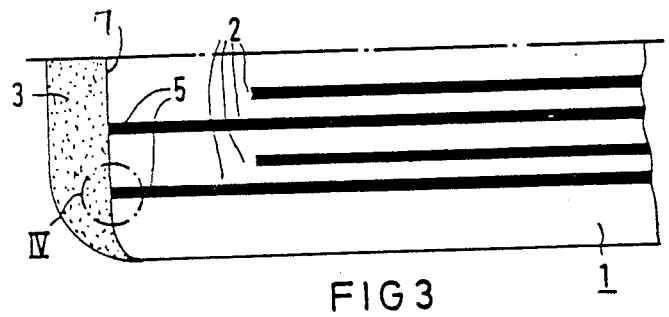
FIG 3
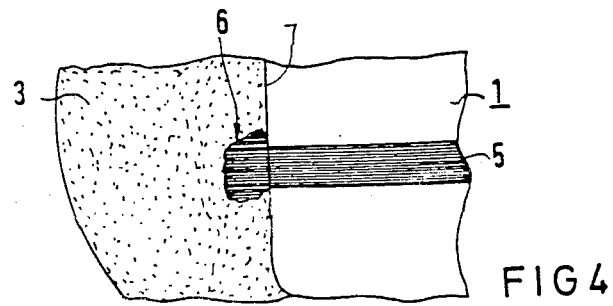
FIG 4

METHOD FOR THE PRODUCTION OF A COMPONENT WITH A FILLED LAYER

FIELD OF THE INVENTION

The invention relates to a method of the production of filled layer components made out of monolithic ceramics by impregnating a ceramic layer structure of dense and porous layers with a liquid impregnating material and by applying contacts.

The method of producing sintered ceramic bodies with porous and dense layers is well known in the art. For example ceramic bodies can be produced according to German Patent DE-PS No. 24 62 006, DE-PS No. 24 62 008 or DE-PS No. 24 45 087 or U.S. Pat. Nos. 3,879,645 and 4,353,957. The partially porous ceramic bodies are then provided with electrically conducting metal fillers by known methods, for example, according to German Patent DE-PS No. 22 18 170 or DE-PS No. 22 64 943, or U.S. Pat. No. 3,829,356 for which diverse process technologies are available. These techniques include impregnating with a silver nitrate solution with the subsequent decomposition of the silver nitrate at elevated temperature to form a precipitate, or by the impregnation with a silver nitrate solution with the subsequent reduction of the silver nitrate with hydrogen at elevated temperature to form metallic silver. Finally, pressure impregnation with liquid metals or alloys, for example, bismuth (Bi), lead (Pb), aluminum (Al), copper (Cu), zinc (Zn), tin (Sn) or also cadmium (Cd) alloys has proved successful.

For use of the components as intended, contacts must be applied on the ceramic which ensure electrical bonding to the metal filler and thereby permit processing of the components to capacitors, for example, in SMD construction. In the application of the contacts there are several alternatives to consider, for example the firing in of noble metal pastes or metal coating by way of the gas phase.

It is already known how to produce filler layer components by the mentioned pressure impregnation or by the so-called centrifugal impregnation with liquid metals or alloys. The contacts must then be applied specifically as porous metal layers on the ceramic blanks. Only then has it been possible, until now, to establish an electrical bond between the metal filler and the contacts, since without contacts or other barrier layers the conventional impregnating materials would, after pressure or centrifugal impregnation, run out of the ceramic, at least in part, when the components are removed from the liquid impregnating bath. However, if porous contacts of noble metal are applied before the impregnation process, problems may arise due to the fact that the noble metal layers become detached to an unacceptable degree in conventional metal baths during the impregnation.

For this reason, specifically, U.S. Pat. Nos. 3,965,552 and 4,071,880 propose the application of a porous sintered glass boundary layer on the end faces of the ceramic body to provide a layer to impede the bleeding of the liquid material after the actual impregnation process. After impregnation, this glass boundary layer must be removed again in a separate process step, whereupon the contacts are applied.

In addition, in a more recent patent U.S. Pat. No. 4,584,629, it is proposed to apply onto the ceramic body, thin, adhering layers wettable by the metal bath, to prevent the liquid impregnating material from bleeding when the parts are being extracted from the bath. These layers, too, must be reinforced when processing the filler layer component into a capacitor, or the layers must be brought into a solderable state. This means a repetition of operations after interruption by the impregnation process, thereby preventing economical production of the capacitor.

This known manufacturing technology is generally expensive and uncertain.

It is an object of the invention to simplify the production of filler layer components and in particular, ceramic capacitors, by pressure impregnation of porous ceramic parts.

SUMMARY OF THE INVENTION

According to the invention, there is provided an impregnation process for filling a ceramic body of porous and dense layers with an impregnating material that wets the ceramic, and applying electrical contacts without any further intermediate steps so that bonding of the contacts to the metal filler takes place.

When pressure impregnating porous ceramic blanks without contacts, the impregnating material must be prevented from running out when the parts are being removed from the molten impregnating bath after the pressure impregnation process. In the present invention this is advantageously achieved by the use of impregnating materials that wet the ceramic. This can be done in particular with indium (IN) compositions, the wetting properties of which vis-a-vis glass are known (Materials and Methods, Vol. 36 (1952), p. 113 to 115).

In particular, lead-indium (Pb-In) alloys have proved successful as impregnating materials. In addition, copper-indium (Cu-In), silver-indium (Ag-In) alloys and other materials have been found to be acceptable. It has been found that by the use of alloys PbAg5In5, PbIn2.5 or PbIn5 as impregnating material the metal filler will not bleed when the ceramic parts are removed from the impregnating bath, because of the wetting action of the indium, and the parts remain completely filled. Any adhering impregnating material at the outer surfaces of the ceramic parts is removed, if necessary, by a chemical after-treatment. After the impregnating process, the application of the contacts and the electrical bond between the metal filler and contacts can then take place in any desired manner. For example, common noble metal pastes, having a suitable firing temperature, can be fired onto the ceramic surfaces to be contacted and the bonding process taking place simultaneously. It is necessary that the heat treatment occur below the melting point of the contacts, but preferably at least in part above the melting temperature of the impregnating material. During the heat treatment, the impregnating material, in fact, emerges from the ceramic pores to be contacted due to the temperature-related volume expansion and due to the phase transition i.e., solid-liquid, and this makes the bonding of the contacts to the metal filler possible.

The contacts can be applied also by known surface coating methods, for example, vapor deposition or sputtering. If necessary, these may be reinforced and optionally bonded by a heat treatment above the melting temperature of the impregnating material. The maximum temperature for use of the capacitors thus made must be regarded as the melting temperature of the impregnating material, otherwise repeated fusing of the metal filler results in changes in the electrical parameters.

Preferably, the melting points of the impregnating materials should be above the melting temperature of conventional solder baths for use of the components as intended.

Further details and advantages of the invention will become evident from the following figure description with reference to the drawing and the respective examples.

BRIEF DESCRIPTION OF THE DRAWINGS

FIG. 1 is a segment of a prior art filler layer component which is impregnated with a non-wetting material;

FIG. 2 and FIG. 3 are segments of a filler layer component according to the invention, and FIG. 4 is a detail from FIG. 3.

In the figures, identical parts are given the same reference symbols. The figures are in part described jointly.

DETAILED DESCRIPTION OF THE INVENTION

In FIGS. 1 and 2 a segment from a component 1 having a layer structure of dense and porous layers 2 is illustrated. If the porous layers are filled with metallic materials and if the outer faces of the component are provided with metallic layers as contacts 3 as shown in FIG. 3, capacitors can be realized due to the dielectric properties of the ceramic. To this end, the porous layers 2 must be filled with an impregnating metal in a suitable manner. This is done, for example, by pressure or centrifugal impregnation, using for example lead-based materials.

In FIG. 1 there is shown a prior art lead-impregnated component 1. Due to the non-wettability of the ceramic by lead, the lead will run out of the ceramic, at least in part, when the component 1 is removed from the liquid impregnating bath. Thus, incompletely filled layer regions 4 result in the layers 2 near the edges. Subsequent electrical bonding of the layers to the contacts is made impossible.

To prevent the liquid impregnating material from running out, the practice has been until now to coat the outer faces 7 of the ceramic component 1 with fine-pored coatings, e.g. by the sintering on of glass frits, which after pressure impregnation had to be removed mechanically. Another procedure uses as a preliminary step, the firing on of a composition containing silver to form silver contacts which permit pressure impregnation. In any case, however an additional expense was necessary.

In FIG. 2 there is shown the same ceramic component 1 as in FIG. 1 filled with an alloy wetting the ceramic in the liquid state. It is seen that the regions 2 are completely filled with impregnating material, so that in this case contacts 3 can subsequently be applied and electrically bonded to the metal filler.

The electrical bonding of the metal filler 5 and contacts 3 is evident from FIGS. 3 and 4. It is apparent that under heat treatments, due to the temperature-related volume expansion and due to the phase transition i.e. solid-liquid, the impregnating material of the metal filler 5 emerges from the ceramic regions 2 to bond to the contacts 3. Advantageously, the heat treatment occurs below the melting point of the contacts 3, but above the melting temperature of the impregnating material. The bonding of the contacts to the metal filler is achieved in region 6.

The procedure for the production of ceramic components with suitable electrical properties will be evident from the following examples:

EXAMPLE 1

Cavity ceramic parts are pressure-impregnated with $PbIn_5$ at a temperature of 420° C. in an autoclave for 30 sec at 10 bars. The contacts are then applied by immersion in a noble metal paste and subsequent firing. The electrical bonding occurs simultaneously with this heat treatment, after about 60 min. at 550° C. in air. The rate of heat increase and decrease during the heat treatment was chosen as 15K/min.

EXAMPLE 2

Cavity ceramic parts are impregnated according to example 1 with $PbIn_5$ at 420° C. for 30 sec. and at 10 bars in an autoclave.

The outer sides are then sputtered with NiAg and reinforced by electroplating. A separate thermal treatment is carried out for bonding the contacts to the metal filler, for about 10 min. at 400° C. in air. The rate of heat increase and decrease has been chosen to be 15K/min.

EXAMPLE 3

The impregnating material $PbAg_5In_5$ is employed at a process temperature between 350° and 500° C. and a pressure between 5 and 10 bars. The contacts are produced according to Examples 1 or 2.

EXAMPLE 4

Cavity ceramic parts are impregnated according to Examples 1 or 3. The outer sides are then completed with NiCr/Ag and thereafter with the desired layer sequence, e.g. NiCr/Ag/Ni/Sn by sputtering or electrodeposition. A separate thermal treatment after the sputter process according to Example 2 is not necessary.

The layers applied according to the various embodiment examples have proved to be well solderable, i.e. the adhesivity is sufficient. In all the capacitors produced from such filler layer components, the electrical properties correspond to the stipulated values.

What is claimed is:

1. A method for the production of a component with filled layers consisting of:

impregnating channels inside of a sinter-ceramic body of dense and porous layers with a liquid metallic impregnating material which in a liquid state is capable of wetting the sinter-ceramic body, applying electrical contacts onto the outside of the sinter-ceramic body after impregnation of the inside channels by the metallic material, and effecting electrical bonding of the contacts to the metallic impregnating material, wherein the impregnating material is a lead-indium alloy having an indium content which is between about 2.5% to about 20% by weight and wherein the impregnating material is prevented from running out of the inside channels of the sinter-ceramic body after impregnation without applying a pre-coating on the outer surface of the sinter-ceramic body prior to impregnation.

2. A method according to claim 1, wherein the impregnating material is an alloy having a melting point lower than the melting point of the contacts and higher than the soldering temperature employed in the use of the component as intended.

3. A method according to claim 2, wherein the melting point of the impregnating material is greater than about 180° C. and less than about 850° C.

4. A method according to claim 1, wherein the contacts are applied after the impregnation process by a metallization technique.

5. A method of claim 4, wherein the metallization technique is selected from the group consisting of applying a metal containing paste and sputtering of metallic materials.

6. A method as in any one of the preceding claims, wherein the bonding of the impregnating metal filler to the contacts subsequently applied on the ceramic body occurs by a heat treatment.

7. A method according to claim 6, wherein the heat treatment is carried out simultaneously with the application of the contacts.

8. A method according to claim 6, wherein the heat treatment occurs in a separate process step following the application of the contacts.

9. A method according to claim 6 wherein the temperature for bonding the impregnating metal filler to the contacts is at least in part greater than the melting point of the impregnating material.

10. A method according to claim 7, wherein the temperature for bonding the impregnating metal filler to the contacts is at least in part greater than the melting point of the impregnating material.

11. A method according to claim 8, wherein the temperature for bonding the impregnating metal filler to the contacts is at least in part greater than the melting point of the impregnating material.

* * * * *